(12) United States Patent
Chang et al.

(10) Patent No.: US 10,991,820 B2
(45) Date of Patent: Apr. 27, 2021

(54) MANUFACTURING METHOD FOR FORMING INSULATING STRUCTURE OF HIGH ELECTRON MOBILITY TRANSISTOR

(71) Applicant: UNITED MICROELECTRONICS CORP., Hsin-Chu (TW)

(72) Inventors: Chun-Ming Chang, Kaohsiung (TW); Wen-Jung Liao, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/953,286

(22) Filed: Nov. 19, 2020

(65) Prior Publication Data

US 2021/0074838 A1 Mar. 11, 2021

Related U.S. Application Data

(62) Division of application No. 16/525,525, filed on Jul. 29, 2019, now Pat. No. 10,892,358.

(30) Foreign Application Priority Data

Jul. 10, 2019 (CN) .......................... 201910618716.0

(51) Int. Cl.
*H01L 29/778* (2006.01)
*H01L 29/66* (2006.01)
*H01L 21/02* (2006.01)

(52) U.S. Cl.
CPC .... *H01L 29/7787* (2013.01); *H01L 21/02178* (2013.01); *H01L 21/02194* (2013.01); *H01L 29/66462* (2013.01)

(58) Field of Classification Search
CPC ....... H01L 29/02; H01L 29/15; H01L 29/122; H01L 29/127; H01L 29/158; H01L 29/365; H01L 29/66; H01L 29/778; H01L 29/7787; H01L 29/66462; H01L 29/7789; H01L 29/737; H01L 29/7786; H01L 29/7782; H01L 29/66431; H01L 29/66242; H01L 29/66318; H01L 21/02; H01L 21/02194; H01L 21/02178; H01L 2924/13051; H01L 2924/13064
See application file for complete search history.

(56) References Cited

U.S. PATENT DOCUMENTS

| | | |
|---|---|---|
| 2005/0145851 A1 | 7/2005 | Johnson |
| 2015/0179876 A1 | 6/2015 | Hu |
| 2017/0069723 A1 | 3/2017 | Linthicum |
| 2017/0213903 A1* | 7/2017 | Tsai ................. H01L 29/778 |
| 2017/0222020 A1* | 8/2017 | Yu ................... H01L 27/0886 |
| 2018/0277646 A1 | 9/2018 | Yao |
| 2018/0374945 A1 | 12/2018 | Chen |

* cited by examiner

*Primary Examiner* — Chuong A Luu
(74) *Attorney, Agent, or Firm* — Winston Hsu

(57) ABSTRACT

A method of forming an insulating structure of a high electron mobility transistor (HEMT) is provided, the method including: forming a gallium nitride layer, forming an aluminum gallium nitride layer on the gallium nitride layer, performing an ion doping step to dope a plurality of ions in the gallium nitride layer and the aluminum gallium nitride layer, forming an insulating doped region in the gallium nitride layer and the aluminum gallium nitride layer, forming two grooves on both sides of the insulating doped region, and filling an insulating layer in the two grooves and forming two sidewall insulating structures respectively positioned at two sides of the insulating doped region.

10 Claims, 4 Drawing Sheets

MANUFACTURING METHOD FOR FORMING INSULATING STRUCTURE OF HIGH ELECTRON MOBILITY TRANSISTOR

CROSS REFERENCE TO RELATED APPLICATIONS

This application is a divisional application of U.S. patent application Ser. No. 16/525,525 filed Jul. 29, 2019, which is herein incorporated by reference in its entirety.

BACKGROUND OF THE INVENTION

1. Field of the Invention

The invention relates to an insulating structure of a high electron mobility transistor and a manufacturing method thereof.

2. Description of the Prior Art

Due to their semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different band-gaps are combined and a heterojunction is formed at the junction between the semiconductor materials as a channel for carriers. In recent years, gallium nitride (GaN) based materials have been applied in the high power and high frequency products because of their properties of wider band-gap and high saturation velocity. A two-dimensional electron gas (2DEG) may be generated by the piezoelectricity property of the GaN-based materials, and the switching velocity may be enhanced because of the higher electron velocity and the higher electron density of the 2DEG High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

The present invention provides an insulating structure of a high electron mobility transistor (HEMT), the insulating structure of a high electron mobility transistor includes a gallium nitride layer, an aluminum gallium nitride layer on the gallium nitride layer, an insulating doped region located in the gallium nitride layer and the aluminum gallium nitride layer, and two sidewall insulating structures positioned at two sides of the insulating doped region. respectively.

The present invention further provides a method of forming an insulating structure of a high electron mobility transistor (HEMT), the method including: firstly, a gallium nitride layer is formed, and an aluminum gallium nitride layer is formed on the gallium nitride layer, next, an ion doping step is performed to dope a plurality of ions in the gallium nitride layer and the aluminum gallium nitride layer, afterwards, an insulating doped region is formed in the gallium nitride layer and the aluminum gallium nitride layer, two grooves are then formed on both sides of the insulating doped region, and an insulating layer is filled in the two grooves and forming two sidewall insulating structures respectively positioned at two sides of the insulating doped region.

The present invention additionally forms two sidewall insulation structures on both sides of the insulation doped region after the insulation doped region is formed. Since the two sidewall insulating structures are disposed on both sides of the insulating doped region, even if a subsequent heating step is performed on the semiconductor device, the activated ions are blocked by the sidewall insulating structures, so that they are not easily dissipated to other places to ensure the insulating effect of the insulating doped region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 are schematic diagrams of a method for manufacturing an insulating structure of a high electron mobility transistor according to the first preferred embodiment of the present invention, in which:

FIG. 2 is a schematic diagram of the step subsequent to FIG. 1;
FIG. 3 is a schematic diagram of the step subsequent to FIG. 2;
FIG. 4 is a schematic diagram of the step subsequent to FIG. 3;
FIG. 5 is a schematic diagram of the step subsequent to FIG. 4;
FIG. 6 is a schematic diagram of the steps after FIG. 5;
FIG. 7 is a schematic diagram of the step subsequent to FIG. 6; and
FIG. 8 is a schematic diagram of the steps after FIG. 7.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the Figures are only for illustration and the Figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
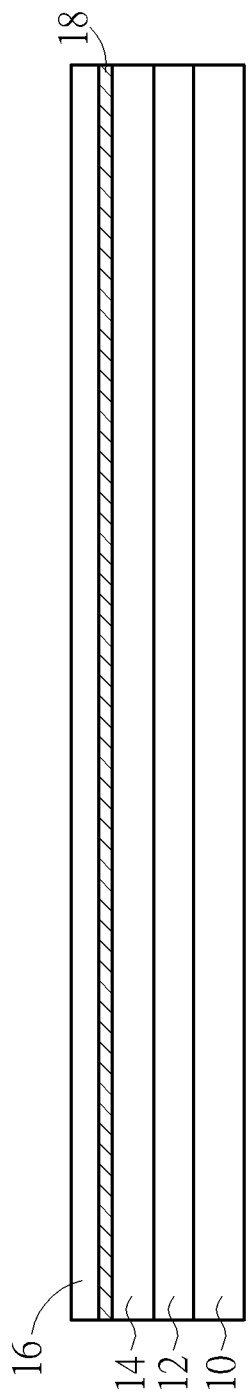
Figure 2:
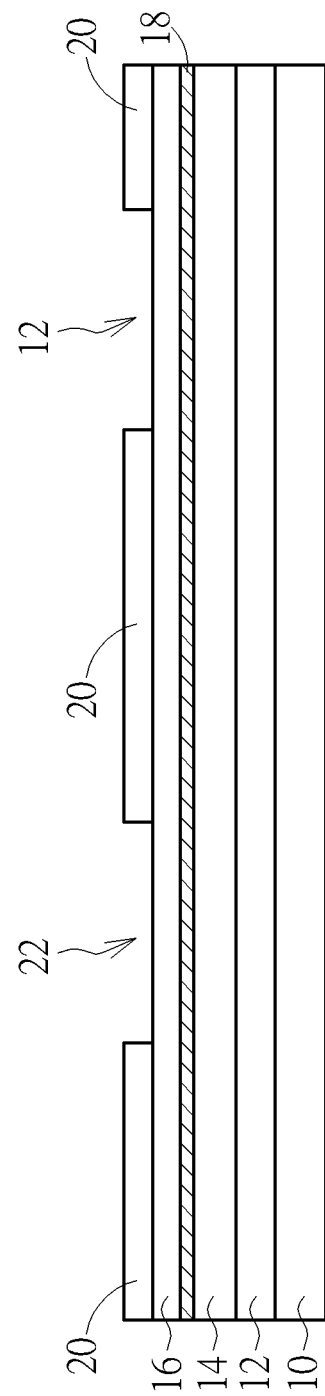
Figure 3:
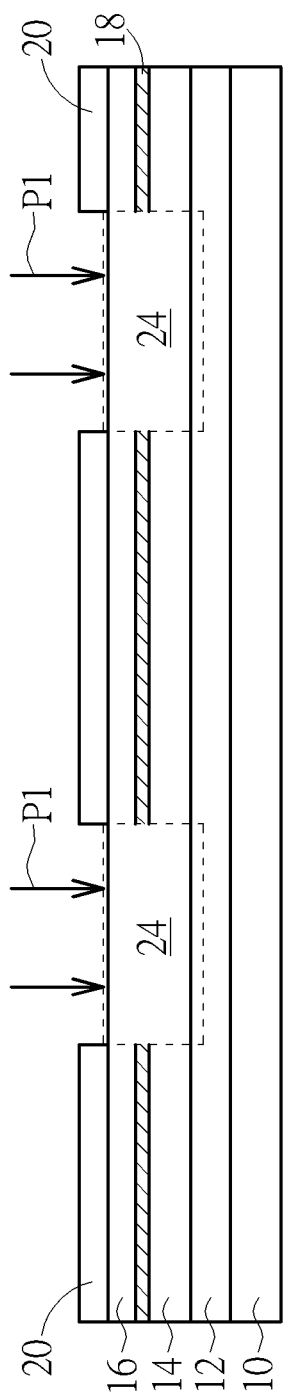
Figure 4:
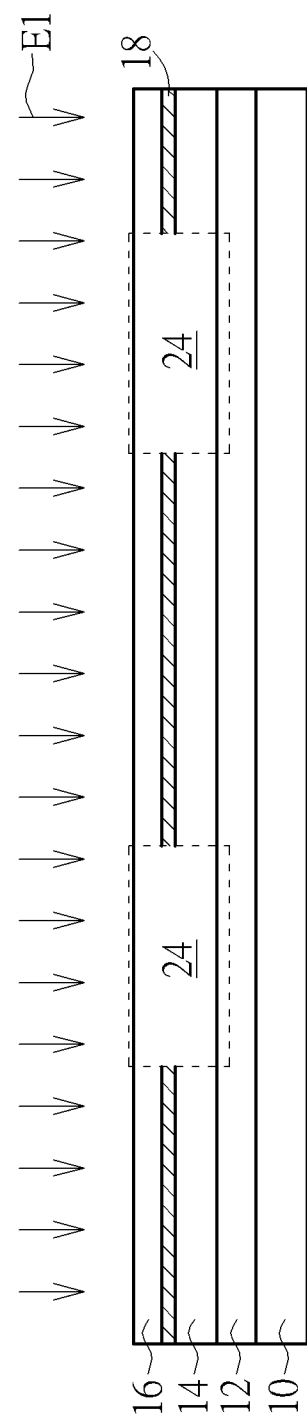
Figure 5:
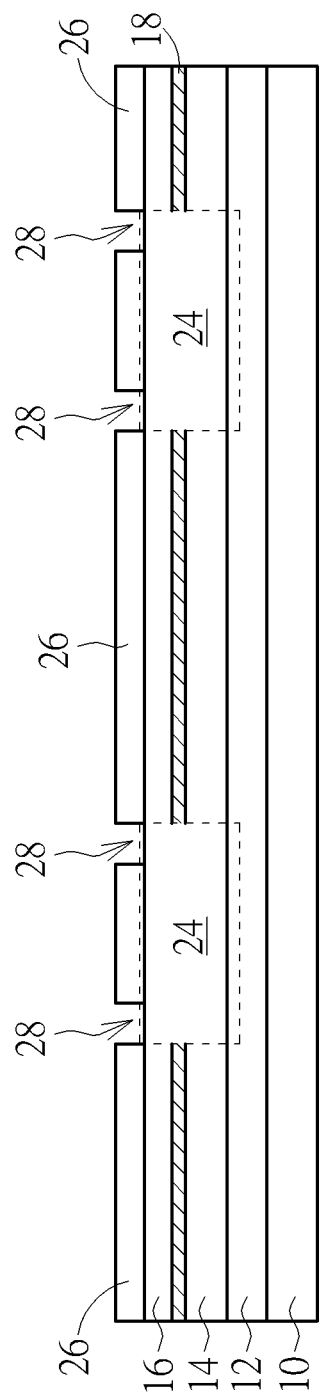
Figure 6:
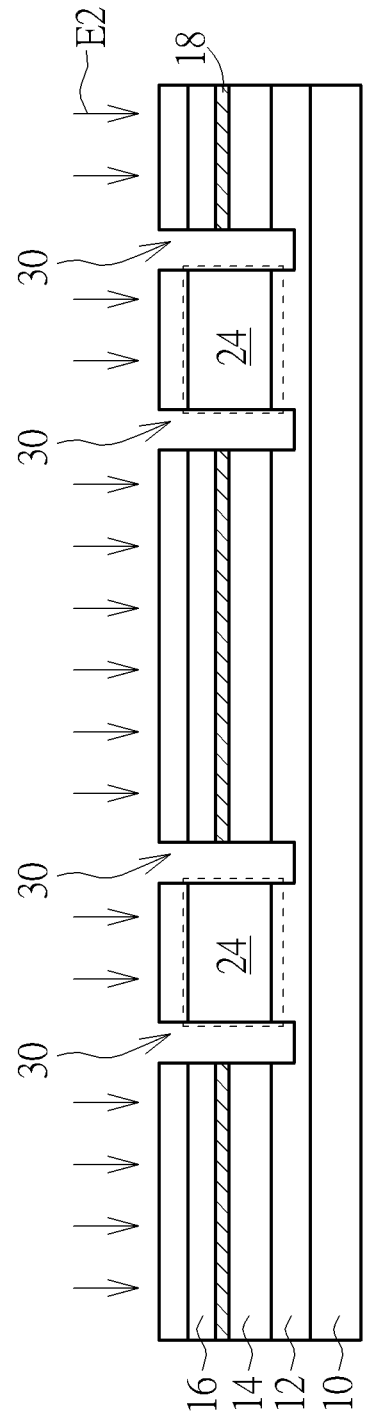
Figure 7:
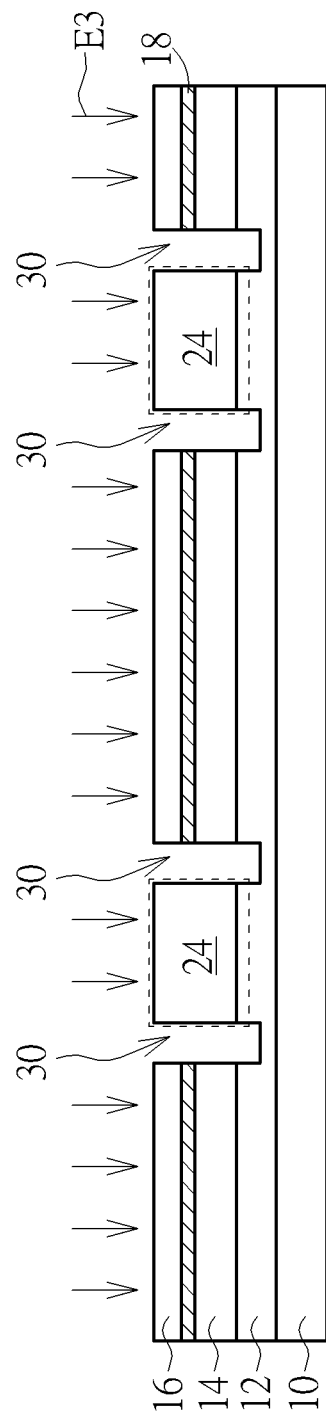
Figure 8:
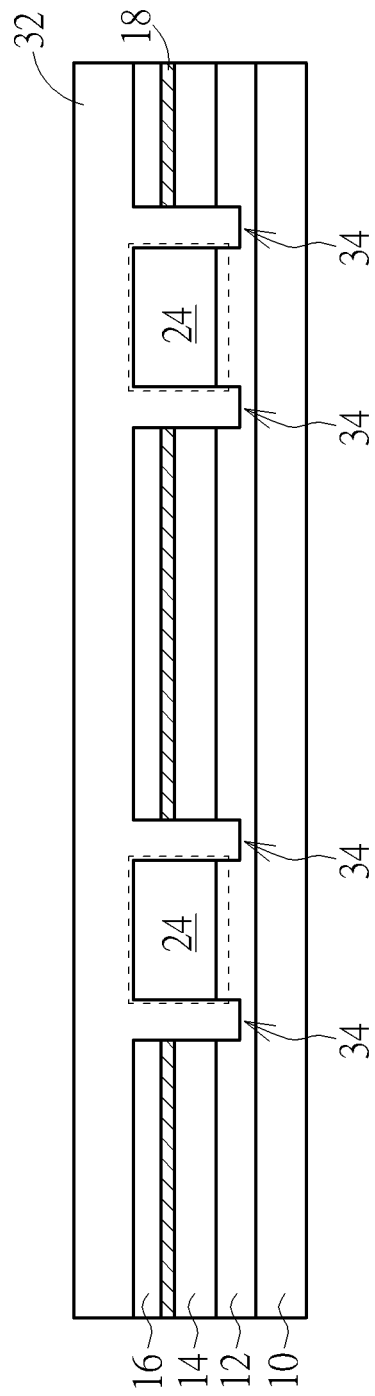

Please refer to FIG. 1 to FIG. 8. FIG. 1 to FIG. 8 are schematic diagrams of a method for manufacturing an insulating structure of a high electron mobility transistor according to the first preferred embodiment of the present invention. FIG. 2 is a schematic diagram of the step subsequent to FIG. 1; FIG. 3 is a schematic diagram of the step subsequent to FIG. 2; FIG. 4 is a schematic diagram of the step subsequent to FIG. 3; FIG. 5 is a schematic diagram of the step subsequent to FIG. 4; FIG. 6 is a schematic diagram of the steps after FIG. 5; FIG. 7 is a schematic diagram of the step subsequent to FIG. 6; and FIG. 8 is a schematic diagram of the steps after FIG. 7. As shown in the FIG. 1, a substrate 10 such as a substrate made from silicon, silicon carbide, or aluminum oxide (or also referred to as sapphire) is provided, in which the substrate 10 could be a single-layered substrate, a multi-layered substrate, gradient substrate, or combination thereof. According to other embodiment of the present invention, the substrate 10 could also include a silicon-on-insulator (SOI) substrate.

Next, a buffer layer 12 is formed on the surface of the substrate 10. The main function of the buffer layer 12 is to help subsequently formed gallium nitride layers to be more easily formed on the substrate 10. For example, if the substrate 10 is a sapphire (alumina) substrate and the lattice constant difference between alumina and gallium nitride is large, a buffer layer 12 needs to be formed between the substrate 10 and the gallium nitride layer, and the lattice constant of the buffer layer 12 is between the lattice constant of the substrate 10 and the lattice constant of gallium nitride. In this embodiment, the buffer layer 12 is, for example, aluminum nitride (AlN), but is not limited thereto.

Next, a gallium nitride (GaN) layer 14 is formed on the buffer layer 12, in which a thickness of the gallium nitride layer 14 could be between 0.5 microns to 10 microns. According to an embodiment of the present invention, the formation of the gallium nitride layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, an aluminum gallium nitride (AlGaN) layer 16 is formed on the surface of the gallium nitride layer 14. In this embodiment, the aluminum gallium nitride layer 16 preferably includes an epitaxial layer formed through epitaxial growth process. Similar to the gallium nitride layer 14, the formation of the aluminum gallium nitride layer 16 on the gallium nitride layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

It should be noted that after the aluminum gallium nitride layer 16 is formed on the surface of the gallium nitride layer 14, a heterojunction is formed at the interface between the buffer layer and barrier layer as a result of the bandgap difference between the two layers. Essentially a quantum well is formed in the banding portion of the conduction band of the heterojunction to constrain the electrons generated by piezoelectricity so that a channel region or a two-dimensional electron gas (2DEG) layer 18 is formed at the interface between the gallium nitride layer and the aluminum gallium nitride layer to further form a conduction current.

In the above-mentioned structure, one of the methods for forming the insulating layer is to perform an ion doping step in the gallium nitride layer and the aluminum gallium nitride layer, such as doping helium (He), phosphorus (P), argon (Ar), nitrogen (N), oxygen (O) or arsenic (As) ions. After the ion doping step is carried out, the two-dimensional electron gas layer will be destroyed, thus cutting off the above conduction current, that is, the ion doped region will form an area equivalent to the insulating layer.

However, the applicant has found that there is a risk in forming the insulating region by doping ions, that is, if a heating step is used in a subsequent step, such as the step of forming a transistor, ions doped in the gallium nitride layer and the aluminum gallium nitride layer may be activated and the originally doped region may overflow, thereby causing the insulating effect of the region to disappear. In other words, after the ion doping step is used to form the insulating region, if a subsequent heating step is carried out, the insulating region may disappear or its insulating ability may be reduced, thus affecting the yield of the high electron mobility transistor.

In order to avoid the above-mentioned problems, as shown in FIG. 2 to FIG. 8, there are shown the schematic flow charts of manufacturing an insulating structure of a high electron mobility transistor (HEMT) according to the present invention. It continues the structure shown in FIG. 1 and continues to manufacture the insulating structure of the high electron mobility transistor. First, as shown in FIG. 2, a patterned photoresist 20 is formed on the surface of the aluminum gallium nitride layer 16, wherein the patterned photoresist includes an opening 22, and the position of the opening 22 roughly corresponds to the position where an insulating region needs to be formed subsequently. In addition, the width of the opening 22 here will be slightly larger than the width of the insulation region actually formed later. In other words, in this step, portions that do not need to form insulating regions will be covered by the patterned photoresist 20.

Next, As shown in FIG. 3, an ion doping step P1 is performed, for example, doping helium (He), phosphorus (P), argon (Ar), nitrogen (N), oxygen (O), or arsenic (As) ions into the aluminum gallium nitride layer 16, the two-dimensional electron gas layer 18, and the gallium nitride layer 14. In some embodiments, if the depth of the doping ions is sufficient, the doping ions may also be doped into part of the buffer layer 12. The region where doped ions are defined herein is the insulating doped region 24. In the insulating doped region 24, since both the aluminum gallium nitride layer 16 and the gallium nitride layer 14 are doped with ions, the two-dimensional electron gas layer 18 between the two is destroyed and disappears. As mentioned above, conduction current can be formed by the existence of the two-dimensional electron gas layer 18. Therefore, if the two-dimensional electron gas layer 18 disappears in the insulating doped region 24, the insulating doped region 24 is an insulating region. That is, the two-dimensional electron gas layer 18 is not included in the insulating doped region 24.

As shown in FIG. 4, a step E1 is performed to remove the patterned photoresist 20, wherein the step E1 of removing the patterned photoresist 20 includes but is not limited to ashing, photolithography, wet/dry etching, planarization (e.g., chemical mechanical polishing CMP or reactive ion etching RIE etch back etching), and the present invention is not limited thereto. Since the method of removing photoresist belongs to the known technology in the art, it will not be described in detail here.

As shown in FIG. 5, a second patterned photoresist 26 is formed on the surface of the aluminum gallium nitride layer 16, wherein the second patterned photoresist 26 includes a plurality of openings 28. The second patterned photoresist 26 described herein may include the same or different materials as the patterned photoresist 20 described above, but is not limited thereto. It should be noted that the positions of the openings 28 correspond to both side edges of each insulating doped region 24. That is, the portions of each of the insulating doped regions 24 near both side edges are exposed, and in addition, the central portion of the insulating doped region 24 or other regions of the non-insulating doped region 24 are covered by the second patterned photoresist 26.

As shown in FIG. 6, an etching step E2 is performed, using the second patterned photoresist 26 as a mask to remove part of the aluminum gallium nitride layer 16 and part of the gallium nitride layer 14 in the insulating doped region 24, and at least two grooves 30 are formed on both sides of the insulating doped region 24. In some embodiments, the depth of the groove 30 can be controlled by adjusting the parameters of the etching step E2, so the groove 30 may reach part of the buffer layer 12, that is, part of the buffer layer 12 may also be removed in the etching step E2. The etching step E2 here may include dry etching or wet etching. Since this etching technique belongs to a technique known in the art, it will not be described in detail here.

As shown in FIG. 7, an etching step E3 is performed to remove the second patterned photoresist 26. The etching step E3 described herein may include the same or different steps as the etching step E1 described above and will not be described in detail here. Next, as shown in FIG. 8, an insulating layer 32 is formed, wherein the insulating layer 32 may contain various insulating materials such as silicon oxide, silicon nitride, silicon oxide, TEOS, etc. The insulating layer 32 may be formed by techniques such as chemical vapor deposition (CVD), physical vapor deposition (PVD), plasma enhanced chemical vapor deposition (PECVD), low pressure chemical vapor deposition (LPCVD), high density plasma chemical vapor deposition (HDP-CVD), rapid thermal chemical vapor deposition (RTCVD), metal organic chemical vapor deposition (MOCVD), atomic layer deposition (ALD), sputtering, thermal oxidation or nitridation, or a combination thereof, and the present invention is not limited thereto. The insulating layer 32 at least fills up the groove 30. After the insulating layer 32 fills up the groove 30, the groove 30 and the insulating layer 32 located therein are collectively defined as a sidewall insulating structure 34. The sidewall insulation structures 34 are located on both sides of the insulation doped region 24. In the present invention, the sidewall insulating structure 34 has an effect of blocking ion escape. In order for the sidewall insulating structure 34 to have a better blocking effect, the bottom surface of the sidewall insulating structure 34 is preferably lower than the bottom surface of the insulating doped region 24, but the present invention is not limited thereto.

Until this step, the basic structure of the insulating structure of the high electron mobility transistor according to the present invention has been completed. As shown in FIG. 8, the insulating structure includes a gallium nitride layer 14, an aluminum gallium nitride layer 16, located on the gallium nitride layer 14, an insulating doped region 24, located in the gallium nitride layer 14 and the aluminum gallium nitride layer 16, and two sidewall insulating structures 34 located on both sides of the insulating doped region 24 respectively.

As mentioned above, the method of doping ions in the gallium nitride layer and the aluminum gallium nitride layer to destroy the two-dimensional electron gas layer and form an insulating region has a disadvantage, that is if a subsequent heating step performed, ions doped in the gallium nitride layer and the aluminum gallium nitride layer may overflow, and the insulating effect of the insulating region may be reduced, or even the insulating region may lose the insulating effect. In order to avoid this situation, the present invention additionally forms two sidewall insulation structures 34 on both sides of the insulation doped region after the insulation doped region 24 is formed. Since the two sidewall insulating structures 34 are disposed on both sides of the insulating doped region 24, even if a subsequent heating step is performed on the semiconductor device, the activated ions are blocked by the sidewall insulating structures 34, so that they are not easily dissipated to other places to ensure the insulating effect of the insulating doped region 24.

Subsequently, other processes can be continuously performed on the semiconductor structure that has completed the insulation region, such as forming the gate, source/drain, contact structure, etc. corresponding to the high electron mobility transistor. Since these processes are known in the art, they will not be described in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming an insulating structure of a high electron mobility transistor (HEMT), comprising:
   forming a gallium nitride layer;
   forming an aluminum gallium nitride layer on the gallium nitride layer;
   performing an ion doping step to dope a plurality of ions in the gallium nitride layer and the aluminum gallium nitride layer,
   forming an insulating doped region in the gallium nitride layer and the aluminum gallium nitride layer;
   forming two grooves on both sides of the insulating doped region; and
   filling an insulating layer in the two grooves and forming two sidewall insulating structures respectively positioned at two sides of the insulating doped region.

2. The method for forming an insulating structure of a high electron mobility transistor according to claim 1, wherein the insulating doped region comprises a plurality of doped ions including helium (He), phosphorus (P), argon (Ar), nitrogen (N), oxygen (O) or arsenic (As) ions.

3. The method for forming an insulating structure of a high electron mobility transistor according to claim 1, further comprising:
   forming a first patterned photoresist layer on the aluminum gallium nitride layer after the aluminum gallium nitride layer is formed; and
   removing the first patterned photoresist layer after the ion doping step is performed.

4. The method for forming an insulating structure of a high electron mobility transistor according to claim 1, further comprising:
   forming a second patterned photoresist on the aluminum gallium nitride layer after the ion doping step; and
   performing an etching step to remove part of the gallium nitride layer and the aluminum gallium nitride layer and form the two grooves.

5. The method for forming an insulating structure of a high electron mobility transistor according to claim 1, wherein the insulating layer covers the insulating doped region.

6. The method for forming an insulating structure of a high electron mobility transistor according to claim 1, wherein a two-dimensional electron gas (2DEG) layer is included between part of the gallium nitride layer and part of the aluminum gallium nitride layer.

7. The method for forming an insulating structure of a high electron mobility transistor according to claim 6, wherein the two-dimensional electron gas layer is not located in the insulating doped region.

8. The method for forming an insulating structure of a high electron mobility transistor according to claim 1, further comprising forming a buffer layer under the gallium nitride layer.

9. The method for forming an insulating structure of a high electron mobility transistor according to claim 8, wherein the range of the insulating doped region includes part of the gallium nitride layer, part of the aluminum gallium nitride layer and part of the buffer layer.

10. The method for forming an insulating structure of a high electron mobility transistor according to claim 1, wherein a bottom surface of at least one of the two sidewall insulating structures is lower than a bottom surface of the insulating doped region.

* * * * *